United States Patent [19]

Parker et al.

[11] Patent Number: 4,620,209
[45] Date of Patent: Oct. 28, 1986

[54] MOSAIC PATTERN OF INFRARED DETECTORS OF DIFFERENT CUT OFF WAVE LENGTHS

[75] Inventors: Sidney G. Parker, Dallas; Rudy L. York, Plano, both of Tex.

[73] Assignee: Texas Instruments Incorporated, Dallas, Tex.

[21] Appl. No.: 656,059

[22] Filed: Sep. 28, 1984

[51] Int. Cl.$^4$ ............................................. H01L 27/14
[52] U.S. Cl. ........................................ 357/30; 357/32; 357/61
[58] Field of Search ..................... 357/30, 61, 45, 32

[56] References Cited

U.S. PATENT DOCUMENTS 4,439,912  4/1984  Pollard et al. ....................... 357/30

Primary Examiner—James W. Davie
Assistant Examiner—Georgia Y. Epps
Attorney, Agent, or Firm—Carlton H. Hoel; James T. Comfort; Melvin Sharp

[57] ABSTRACT

The disclosure relates to an infrared detector and method of making an infrared detector having HgCdTe detectors in the same focal plane of different compositions responsive to two or more different infrared frequency windows. This is accomplished by using $SiO_2$ and/or $Si_xO_yN_z$ for masking and/or isolation during liquid phase epitaxial growth of the HgCdTe. The $SiO_2$ and/or $Si_xO_yN_z$ are formed by plasma deposition.

4 Claims, 1 Drawing Figure

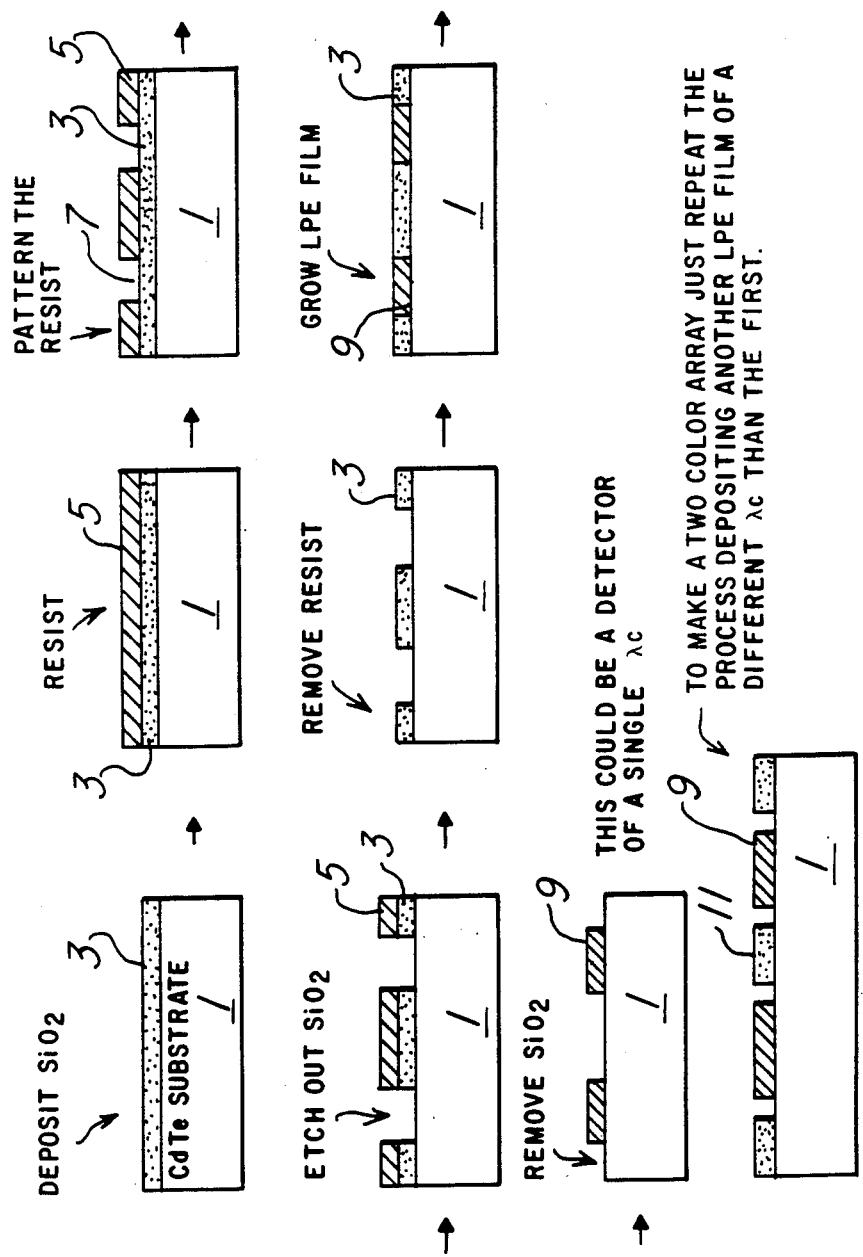

MOSAIC PATTERN OF INFRARED DETECTORS OF DIFFERENT CUT OFF WAVE LENGTHS

BACKGROUND OF THE INVENTION

1. Field of the Invention

This invention relates to infrared detectors and, more specifically, to forming infrared detectors having semiconductor films of different composition in a mosaic pattern in the same focal plane.

2. Brief Description of the Prior Art

Infrared detectors of the type having mercury cadmium telluride film for detecting infrared radiations normally have a very small frequency window of operation, this window being based upon the percentage of mercury to cadmium in the film. These windows have been very accurately determined and it is also known that the change in frequency response is a linear function of the change in ratio of mercury to cadmium in the mercury cadmium telluride film. Mercury cadmium telluride detectors, when formed with a single layer of mercury cadmium telluride, are therefore responsive to a predetermined infrared frequency window, depending upon the formulation of the film. While such infrared detectors find great utility in the art, it is often desirable or even necessary to provide detectors which have a greater window of operation than is possible with use of a single mercury cadmium telluride layer of a single composition. In order to increase the frequency range of such detectors, it has been determined that more than one different mercury cadmium telluride composition, each with a different ratio of mercury to cadmium, can be used to provide response to additional windows of infrared frequencies. $Hg_{(1-x)}Cd_xTe$ films for different values of x which correspond to material with different wave length cut-offs have been prepared by successive deposition of one layer on top of another. These films have been deposited by liquid phase epitaxy (LPE), metallic organochemical vapor deposition (MOCVD) or molecular beam epitaxy (MBE) methods with MBE being the one most used. Detectors of this type have been provided in the prior art by forming a single layer of mercury cadmium telluride over a cadmium telluride substrate such as by liquid phase epitaxial growth and then forming a second mercury cadmium telluride layer of a different composition over the first mercury cadmium telluride layer, also by liquid phase epitaxial growth, and then etching away a portion of the topmost layer to expose regions of the two layers to the incoming infrared radiations. Such detectors are responsive to two different infrared frequency windows, thereby increasing the bandwidth of the detector. Problems with such prior art methods are that the two different mercury cadmium telluride layers of different composition are not in the same focal plane. Furthermore, the etch back of the first layer of film in the two layer system results in poor image definition. Accordingly, it is desirable to provide an infrared frequency detector which has a large window of operation and yet does not display the problems inherent in the prior art system described above.

SUMMARY OF THE INVENTION

In accordance with the present invention, there is provided a mercury cadmium telluride infrared detector which overcomes the above enumerated problems, has a large infrared frequency window of operation and also has all detecting elements in a single focal plane. This is accomplished by use of the fact that neither mercury cadmium telluride films nor the LPE melt solution adhere to silicon dioxide or silicon oxynitride ($Si_xO_yN_z$) and this property results in a capability of building a detector of the type desired as noted above.

Briefly, in accordance with the present invention, a substrate is provided of cadmium telluride, it being understood that other substrate materials which have the same type lattice structure as the semiconductor film to be deposited thereon subsequently in the process and which have high resistance or effective insulating properties can be used. A silicon dioxide or silicon oxynitride layer is then formed over the face of the cadmium telluride substrate by plasma deposition or chemical vapor deposition. A resist is then formed over the silicon dioxide or silicon oxynitride layer, the resist then being patterned in desired manner and the silicon dioxide or silicon oxynitride then being etched in those regions wherein the resist has been removed during patterning. Preferred etching solutions are HF or ammonium fluoride, the etching taking place down to the surface of the cadmium telluride substrate. The resist is then removed and the entire surface of the cadmium telluride substrate with patterned silicon dioxide or silicon oxynitride thereon is subjected to growth of a mercury cadmium telluride film by liquid phase epitaxial deposition. The composition of the mercury cadmium telluride film will depend upon the ratio of mercury to cadmium utilized in the epitaxial growth process. This film will adhere to the cadmium telluride substrate since the lattice structures thereof are very similar in nature but it will not adhere to the silicon dioxide or silicon oxynitride regions. This procedure will continue until a sufficient growth of mercury cadmium telluride has been formed over the cadmium telluride substrate. The silicon dioxide or silicon oxynitride is then removed by etching with a solution of either HF or ammonium fluoride to provide a detector having a mosaic pattern and capable of receiving a single window of infrared frequencies, this window depending upon the mercury to cadmium ratio during epitaxial deposition.

In order to increase the window size or effectively make the detector responsive to additional colors, the entire procedure is repeated whereby a silicon dioxide or silicon oxynitride layer is formed over the entire substrate including the mercury cadmium telluride mosaic. A resist is again deposited over the entire silicon dioxide or silicon oxynitride layer and patterned as in the prior series of steps except that the patterning will be such that the originally produced mercury cadmium telluride mosaic will ride beneath the resist and other regions whereon growth did not originally take place will now be exposed. The silicon dioxide or silicon oxynitride is then etched in the new regions that have been patterned out as before, the resist is then removed and a further mercury cadmium telluride film of different mercury to cadmium ratio is grown by liquid phase epitaxial deposition as before. The silicon oxide or silicon oxynitride is then removed, resulting in a detector having a mosaic responsive to two different infrared frequency windows. It can be seen that all of the elements of the mosaic responsive to both different infrared frequency windows are in the same focal plane with the different type compositions being isolated from one another. Furthermore there is no problem of definition caused by etch back since the processing step is not required in the present process relative to layers positioned one on top of the other.

BRIEF DESCRIPTION OF THE DRAWINGS

The drawing is a schematic diagram of the processing steps utilized in formation of an infrared detector in accordance with the present invention.

DESCRIPTION OF THE PREFERRED EMBODIMENT

Referring now to the figure, there is shown a schematic diagram of the processing steps required to produce an infrared detector in accordance with the present invention. There is shown a cadmium telluride substrate 1 which is essentially insulating in nature due to its high resistivity. A silicon dioxide layer 3 is then formed on a surface of the substrate 1 by plasma deposition of silicon dioxide at about 380° C. to a depth of about 5000 Angstroms. A standard photoresist coating 5 is then formed over the silicon dioxide layer 3 and it is then patterned in standard manner to provide a pattern over the silicon dioxide 7 in those regions where the detector mosaic having a first operating window is to be formed. The silicon dioxide 3 in the patterned region 7 is then etched using HF to remove the silicon dioxide in the patterned region down to the cadmium telluride substrate 1. The resist 5 is then removed and a film of mercury cadmium telluride 9 of predetermined mercury to cadmium ratio to provide a predetermined infrared frequency window is deposited by liquid phase epitaxial deposition over the entire surface of the substrate 1, the film growing only in those places wherein the cadmium telluride substrate is at the surface to provide a crystal structure the same as the deposited mercury cadmium telluride film, the film not adhering to the silicon dioxide. The result is that a film of mercury cadmium telluride of desired ratio of mercury to cadmium is formed on the cadmium telluride substrate in those regions from which the silicon dioxide has been previously etched. The silicon dioxide which remains on the substrate 1 is then removed using HF to provide a first stage of a detector responsive to a predetermined infrared frequency window.

In order to increase the window of frequency response of the detector, the entire process is again repeated wherein silicon dioxide 3 is deposited over the entire substrate including those detector regions 9 already formed. A resist 5 is then formed over the entire silicon dioxide layer 3 as before and is patterned at pattern region 7, it being noted that the pattern takes place in those regions wherein detectors 9 are not previously formed, the detectors 9 previously formed now being beneath resist. The exposed silicon dioxide 3 is again etched using HF, the resist 5 is removed and a liquid phase epitaxial film of mercury cadmium telluride 11 having a ratio of mercury to cadmium different from that used in the first series of steps is deposited in those regions of the substrate which are exposed as before. The silicon dioxide 3 is again removed using HF to provide a substrate 1 having a mosaic thereon of detector elements 9 and 11 responsive to two different windows of infrared frequencies or, in other words, two different colors.

It can be seen that there has been provided an infrared detector capable of response to two different infrared frequency windows and wherein all of the detector elements are in the same focal plane. It should also be understood that the silicon dioxide deposit utilized hereinabove can be replaced by a deposit having the formulation $Si_xO_yN_z$ for masking during the liquid phase epitaxial growth step.

Although the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. In an infrared detector comprising:
  (a) a substrate,
  (b) a first layer of HgCdTe on said substrate in a predetermined focal plane; and
  (c) a second layer of HgCdTe on said substrate spaced from said first layer, having a ratio of Hg to Cd different from said first layer and in said predetermined focal plane.

2. In an infrared detector as set forth in claim 1 wherein said substrate is substantially electrically insulative.

3. In an infrared detector as set forth in claim 1 wherein said substrate is formed from CdTe.

4. In an infrared detector as set forth in claim 18 wherein said substrate is formed from CdTe.

* * * * *